United States Patent
Loreit et al.

[19]

[11] Patent Number: 6,011,390

[45] Date of Patent: Jan. 4, 2000

[54] SENSOR CHIP WITH MAGNETORESISTIVE WHEATSTONE BRIDGES FOR DETERMINING MAGNETIC FIELD DIRECTIONS

[75] Inventors: Uwe Loreit; Fritz Dettman; Wulf Andrä, all of Wetzlar, Germany

[73] Assignee: Institut für Mikrostrukturtechnologie und Optoelektronik E.V., Wetzlar, Germany

[21] Appl. No.: 08/973,608

[22] PCT Filed: Jun. 11, 1996

[86] PCT No.: PCT/EP96/02538

§ 371 Date: Dec. 11, 1997

§ 102(e) Date: Dec. 11, 1997

[87] PCT Pub. No.: WO97/00426

PCT Pub. Date: Jan. 3, 1997

[30] Foreign Application Priority Data

Jun. 14, 1995 [DE] Germany .......................... 195 21 617

[51] Int. Cl.[7] .............................. G01B 7/30; G01D 5/16; G01R 33/09
[52] U.S. Cl. .................................... 324/207.21; 324/252
[58] Field of Search ........................ 324/117 R, 207.21, 324/207.25, 252; 338/32 R

[56] References Cited

U.S. PATENT DOCUMENTS

| | | | |
|---|---|---|---|
| 4,533,872 | 8/1985 | Boord et al. | 324/252 |
| 5,602,471 | 2/1997 | Muth et al. | 324/252 X |

FOREIGN PATENT DOCUMENTS

| | | |
|---|---|---|
| 0093870 | 11/1983 | European Pat. Off. . |
| 4014885 | 11/1990 | Germany . |
| 4233331 | 4/1994 | Germany . |

Primary Examiner—Gerard Strecker
Attorney, Agent, or Firm—Garrettson Ellis

[57] ABSTRACT

An arrangement for a magnetoresistive sensor chip has two Wheatstone bridges to determine the sine and cosine of the angle formed between a chip edge and the direction of the magnetic field. All resistances of the bridges consist of a plurality of magnetoresistive laminated elements (2) with current connections made of highly conductive thin films with parallel edges. When the resistances of a bridge are directly electrically interconnected, these edges form angles (5) of 90° each. The parallel edges of the corresponding resistances of the sine and cosine bridges are mutually offset by 45°. The magnetoresistive laminated elements (2) are distributed on the chip surface to reduce angle measurement errors to a minimum. Also disclosed are arrangements that allow the sensor chips to be used for measuring angles and positions.

20 Claims, 3 Drawing Sheets

SENSOR CHIP WITH MAGNETORESISTIVE WHEATSTONE BRIDGES FOR DETERMINING MAGNETIC FIELD DIRECTIONS

The subject matter of the present invention is a sensor chip having resistive layers being dependent on a magnetic field to be used for contactless measuring angles and positions.

The advantages of employing sensor chips, the thin-film resistances of which exhibit the anisotropic magnetoresistance effect are already set out for such measurements for example in a paper by A. Petersen and T. Rinschede "Berührungslose Winkelmessung mit magnetoresistiven Sensoren", in Elektronik 6/1994, pages 91–93. A disadvantage of using a single sensor bridge is the highly limited measuring range and the high temperature dependence of the output signal of the bridge, Therefore, sensor chips having two bridges for determining the sine and cosine values of the angle of the magnetic field with respect to an edge of the sensor chip are already disclosed in the Patent Specification DE 43 17 512 and in a paper by A. Petersen "Berührungslose Winkelmessung" in Design & Elektronik Sensortechnik, May 1995, pages 64–66. The angle is obtained therein from the ratio of the output signals of both bridges. As both sensor chips are arranged on the same chip the difference of their temperatures is merely minor, and, hence, the ratio of both output signals becomes essentially independent of the temperature. However, a disadvantage of both sensor chips is that the magnetoresistive strip conductors which form the bridge resistances have a form-anisotropy which substantially exceeds the inherent anisotropy of a layer extending to infinity. The higher the total anisotropy of the respective layer strip, the higher is also the deviation of the direction of the external magnetic field from the direction of magnetization within the interior of the layer material. The output signal of the bridge, however, always corresponds to the direction of the internal magnetization. Therefore, deviations occur being observed as corresponding errors of the angle measurement, During evaluation it is extremely complicated to correct these errors because magnetoresistive layer strips with different longitudinal directions and different lengths are used. Therefore, the deviations of each magnetoresistive layer strip are of different magnitudes. Therefore, in the disclosed arrangements, the only possibility for eliminating the errors is to employ magnets having very high field strengths. This means that magnets having considerable volumes of magnetic materials which provide high field strengths, have to be employed and that only relatively small distances between the magnet and the sensor chip are allowed. The first necessity mentioned results in high cost, the latter in narrow assembly tolerances.

A further drawback of employing long magnetic layer strips of different longitudinal directions on the chip surface is solely caused by geometry. The total chip surface cannot be used to accomodate the layer providing the magnetic field dependent resistance due to the angles of about 45° between the strips. Hence, a larger chip surface is absolutely necessary which results in higher chip cost.

The influence of the anisotropy of the layers is substantially eliminated in an arrangement which utilizes the planar Hall-effect in magnetoresistive layers, disclosed in the Patent Specification EP 0 217 478 B1. The disadvantage connected therewith is, however, that only very small resistances of the elements can be implemented. This directly leads to small output voltages of the measuring elements as these voltages are proportional to the applied operating voltages. Additionally, when employing circular thin-film areas having nearly dot-like current feeding points at the circular circumference, the directions of the current lines are not parallel. Hence, a distribution of the current directions always exists with respect to the direction of the magnetization, and the maximum resistance variation of the magnetic layer achievable with parallel current lines is hardly reached. In correspondence with such a reduced resistance variation, the output signal is also reduced. A distribution of the current directions also exists when using resistance strips in form of circular arcs instead of said circular ones. This results in a reduction of the amplitude of the output voltage with respect to the maximum possible voltage by a factor of $\pi/2$. When using narrow conductor lines as used for the laminated conductors in form of circular arcs the form-anisotropy, more than that, has already again a considerable value so that greater deviations between the field direction to be measured and the magnetization of the layer occur. In case of these narrow laminated conductors in the proposed rotationally symmetric arrangement, furthermore, the utilization of the chip surface as sensible sensor surface is only possible to a small extent.

Therefore, it is an object of the invention to provide the arrangement and use of a sensor chip for determining the sine and cosine values of the angle between a magnetic field and a line on the sensor chip, as used for measuring angles and positions, such that only small field strengths are required, that the chip surface can be minimized, that the sensor chip supplies large output signal amplitudes and that large distances between the magnet and sensor chip are allowable.

This object is solved by this present invention. The bridge resistances are composed of a plurality of magnetoresistive laminated elements. These laminated elements comprise highly conductive thin-film surfaces each having two opposing edges by means of which the current direction is determined in the laminated elements. As the current directions within the resistances of the same bridge are mutually rotated by 90° the oppositely varying resistance values necessary for the bridges are obtained in each bridge arm. The angle of 45° between the edges of the laminated elements of the sine and cosine bridges constitutes the necessary requirement for the phase shift of 45° which exists between the two bridge output signals, The laminated elements are designed such that they have only negligible form anisotropies. The only reason therefore is the fact that the length of the elements is not essentially different from the width thereof. Therefore, a plurality of them is connected in series. This results in a high resistance to which a high operating voltage can be applied without a high generation of heat on the chip surface. Hence, high output voltages of the bridges are possible as they are proportional to the applied operating voltage. The small form-anisotropy which is possible in this arrangement and a small inherent anisotropy of the magnetoresistive layer result in a small deviation of the direction of the internal magnetization of the laminated elements from the external field direction so that the field direction can be determined from the output signals of both sensor bridges with high precision.

As the same geometric figure and the same dimensions are used for each magneoresistive laminated element the total anisotropies thereof are identical at any location, and systematic angle dependent variations do not arise when angularly rotating the sensor chip with respect to the magnetic field.

Providing the magnetoresistive laminated elements in form of squares leads to the advantage that, when adjusting the structure of the highly conductive thin-film surfaces with respect to the magnetoresistive squares in the four different mutually rotated positions, a deviation of adjustment does not cause a resistance variation of the magnetoresistive laminated elements, and that thereby the manner of forming the layers already provides bridges having very small inherent offset voltages.

Providing all contact surfaces for connecting the operating voltage and the output voltages along an edge of the sensor chip leads to the advantage that the magnetic field sensitive surface of the sensor is situated adjacent the opposite edge and thus can be positioned in close distance with regard to parts producing magnetic fields such as coils or permanent magnets. Here, far higher magnetic field strengths exist than at larger distances so that measuring the sine and cosine values of the angles with respect to the magnetic field exhibits smaller errors.

Providing all magnetoresistive laminated elements, the connecting lines and the contact surfaces in one plane eliminates crossovers of lines and therewith the necessity of providing insulating layers.

The discussed sensor chip arrangement is suitable to measure an angle which is defined between an edge of the sensor chip and the direction of a magnet. In a particular case the sensor is provided above a bar magnet such that the mid-vertical of the sensitive surface of the sensor chip is aligned with the mid-vertical of the bar magnet, and the magnetizing direction of the bar magnet is orthogonal to this mid-vertical. As in known magnetoresistive sensors a full sine and cosine period is measured at both bridge outputs when the bar magnet rotates by 180°. The tangent of the angle to be measured is generated by forming the ratio from the sine and cosine signals. Forming the ratio leads to a measurement result which is independant of both the temperature of the sensor chip and the temperature of the magnet.

In order to achieve a high angle resolution the sensor chip is arranged near the circumference of a magnet wheel that, at least on its surface, is alternatingly magnetized in opposite directions. As the magnetic field orthogonally emanates from the north poles and orthogonally enters into the south poles a. rotation of the magnetic field direction by 180° exists between both poles. Thereby, a full period of the sine and cosine signals, respectively, appears at the outputs of the sensor chips. The number of poles passing the sensor is determined by means of known incremental counting techniques. The exact angle position between the poles is again obtained by forming the ratio of both output signals. Advantageously, the angle determining sensor chip is suitable for the measurement at different pole distances of the magnet wheels.

For measuring a position, a magnetic field generating arrangement, which, among other solutions, may be a coil or a bar magnet, is moved in a direction in respect to the sensor chip. In case the sensor chip is, for example, arranged such that it moves along a parallel line of the axis of the bar magnet, which axis is also the direction of magnetization of the bar magnet, the position can be uniquely determined from the angle of the magnetic field with respect to the parallel line, which is measured by the sensor chip. Here again the advantage is that the temperatures of the magnet as well as of the sensor chip do not influence the result of measurement. In addition, it is possible to linearly relate the measured angle to the positon with small error. The distance between the magnet and sensor chip can have the dimension of half the magnet length. Distance variations do not cause a positional error when limiting the path length to be measured to about half the magnet length.

If, instead of a bar magnet, a simple magnet is used which is magnetized in alternating directions in areas which have a certain length in the direction of movement, an incremental length measurement with high resolution is possible in an analogous manner to the above outlined angle measurement using the magnet wheel. Again, the inventive sensor chip provides the advantage that it is suitable for all period lengths of the magnet which is magnetized in alternating directions.

DESCRIPTION OF SPECIFIC EMBODIMENTS

Figure 1:
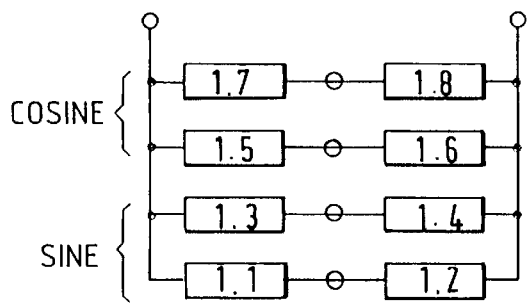
FIG. 1 is a diagram showing the circuitry of two parallel Wheatstone bridges in accordance with prior art, which circuitry is also used in the invention.

FIG. 1 shows a circuit diagram of two parallely connected Wheatstone bridges. The first bridge consists of the resistances 1.1; 1.2; 1.3 and 1.4 and is designated as sine bridge. The second bridge consists of the resistances 1.5; 1.6; 1.7 and 1.8 and is the cosine bridge. This circuit can be implemented both in the prior art sensor chip and the sensor chip according to the invention.

Figure 2:
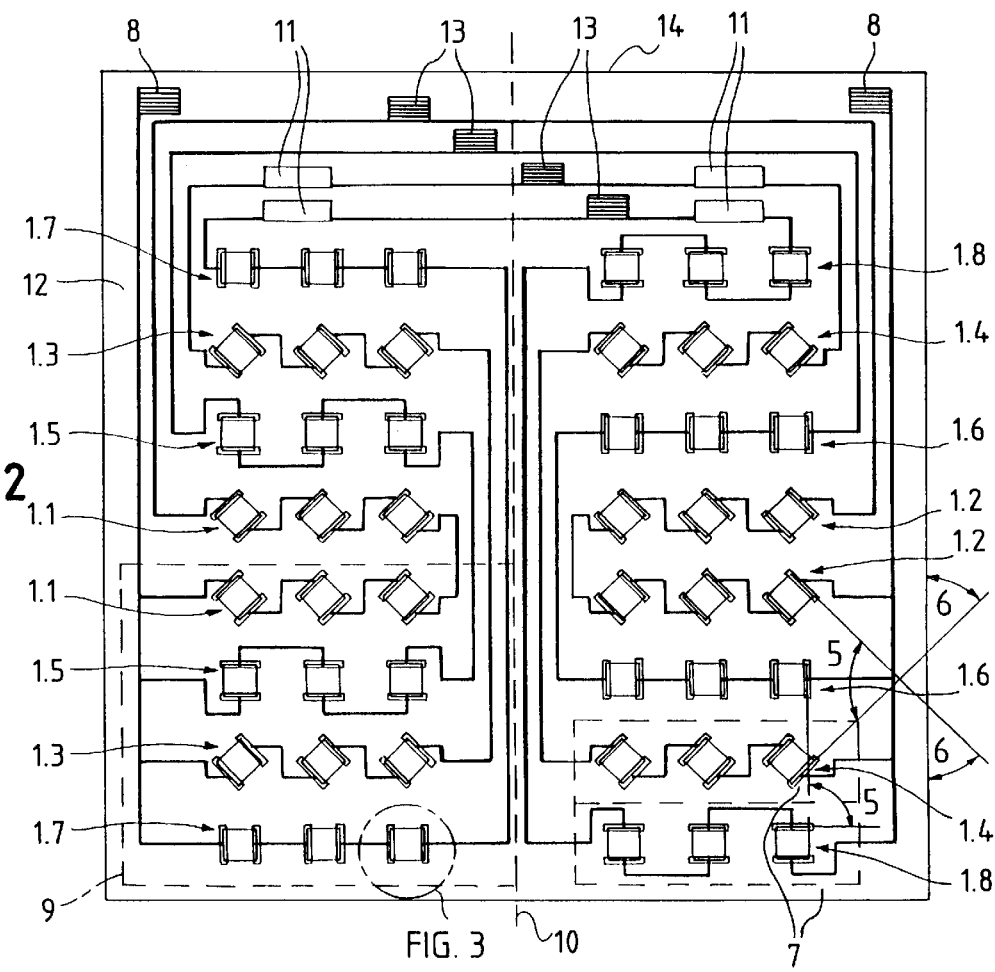
FIG. 2 shows a special embodiment of the sensor chip according to the invention.
Figure 3:
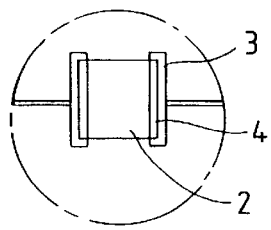
FIG. 3 shows a partial view of the sensor chip as indicated in FIG. 2.

FIG. 2 shows a diagram of a special embodiment of the sensor chip 12 according to the invention. Here, all bridge resistances 1.1 to 1.8 are formed from identical magnetoresistive laminated elements 2. Such a laminated element 2 is shown in a larger scale in FIG. 3. The magnetoresistive element 2 comprises, besides a square surface of a layer exhibiting an anisotropic magnetoresistance effect, highly conductive thin-film surface elements 3 for establishing an electric contact, the thin-film surface element edges 4 facing the center of the squares are in parallel to each other. The magnetoresistive laminated elements 2 are each arranged in rows as linear resistance areas 7, only two of which are circumscribed by broken lines and indicated in the figure. The two resistances 1.1 and 1.2, 1.3 and 1.4, 1.5 and 1.6 as well 1.7 and 1.8 belonging to each bridge arm are each arranged on the sensor chip 12 in symmetry to the center line 10 of the chip surface. The edges 4 of the magnetoresistive laminated elements 2 which are each connected in series to form a bridge arm in the electric circuit of the two individual bridges form an angle 5 of 90° with each other. The edges 4 of the magnetoresistive laminated elements 2 of the resistances which correspond to each other in the sine and cosine bridges 1.1 and 1.5; 1.2 and 1.6; 1.3 and 1.7; 1.4 and 1.8 form angles 6 of 45° with each other. Both bridges are connected to the operating. voltage contacts 8. The linear resistance areas 7 which are connected to the same operating voltage contact 8 alteratingly belong to the sine and to the cosine bridge. Each resistance 1.1 to 1.8 consists of two linear resistance areas 7 which are connected in series and which are arranged in a meander-shaped manner such that, in each meander branch 9, the adjacent linear resistance areas 7 each alternatingly belong to the sine and to the cosine bridge. In actual embodiments of the sensor chip, contrary to FIG. 2 not only three magnetoresistive laminated elements 2, but a plurality of them are arranged on the sensor chip 12, and not only two meander branches but substantially more thereof. The dimensions of the sensor chips 12 are in the range of several millimeters, those of the magnetoresistive laminated elements 2 in a range of about 10 micrometers. The contact surfaces 13 for the output signals of both bridges and the operating voltage contacts 8 are all adjacent to a chip edge 14. Here, the balancing surfaces 11 for zero voltage adjustment are also provided for both bridges. Hence, the sensitive surface 17 (FIGS. 4 and 6) of the sensor chip 12, in which surface the magnetic field dependent magnetoresistive laminated elements 2 are arranged, is displaced towards the rim lying opposite to this edge 14.

Figure 4:
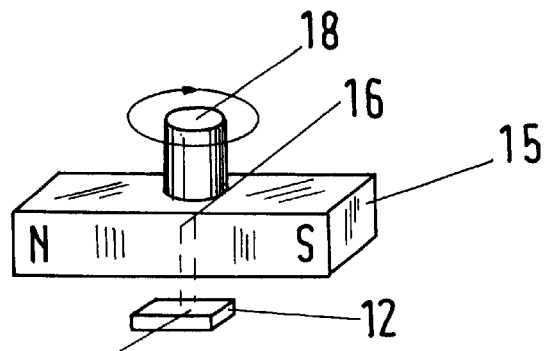
FIG. 4 shows a sensor chip according to the invention together with a bar magnet for angle measurement.

FIG. 4 shows an arrangement for angle measurement. A permanent magnet 15 with poles N and S and with the mid-vertical 18 of its surface facing the sensor chip 12 is rotatably provided above the sensor chip 12, the sensitive surface 17 of which and the mid-vertical 16 of this surface 17 are indicated in the drawing. Both mid-verticals 16 and 18 have to be aligned in order to measure the angle between the edge 14 of the sensor chip 12 and a longitudinal edge of the magnet 15 with an error as small as possible.

Figure 5:
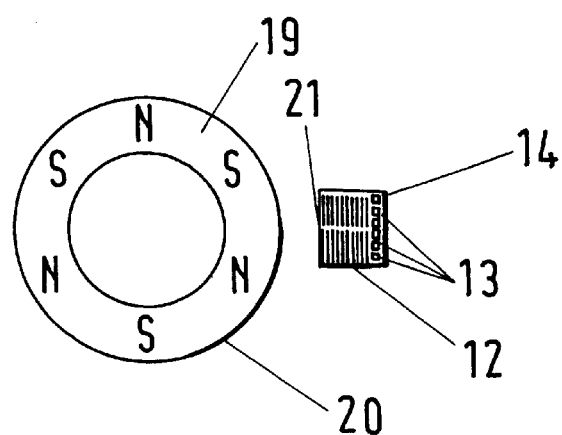
FIG. 5 shows a sensor chip according to the invention together with a magnet wheel for angle measurement with high resolution.

FIG. 5 shows the arrangement for an angle measurement with high resolution using the sensor chip 12. The plane of the sensor chip 12 is also the plane of the magnet wheel 19 which, at least along its circumference 20, is alternatingly magnetized in opposite directions. Therein, edge 21 being opposite to edge 14 near which the contact surfaces 13 are located, faces the. magnet wheel. When rotating the magnet wheel by an angle corresponding to the distance of a south pole S from a north pole N, the field direction rotates by 180° at the location of the sensor chip 12, and the output signals of the sine and cosine bridges cycle through a full period. Thereby, a sensitivity of the angle measurement is achieved, which is higher by the number of the poles of the magnet wheel 19 than in case of using a bar magnet 15 of FIG. 4. The count of the poles already having passed the sensor chip 12 can be determined in accordance with known incremental measuring techniques so that the total angle variation is always known with respect to an initial value.

Figure 6:
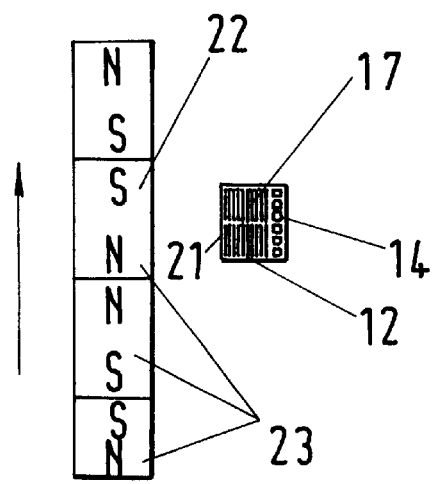
FIG. 6 shows a sensor chip according to the invention together with a linearity movable or displaceable magnet for positon measurement.

FIG. 6 shows the arrangement of the sensor chip 12 for measuring a linear position variation with respect to a permanent magnet 22 which can perform a reciprocating movement in the direction of an indicated arrow. The magnet comprises in the direction of movement a plurality of areas 23 which are alternatingly magnetized in opposite directions. The edge 21 of sensor chip 12 is aligned in parallel to the direction of movement of the permanent magnet. The field direction varies by a full period length at the location of the sensor chip 12 when the magnet 22 performs a passing movement by the distance of a north pole N from a south pole S. Thereby, both sensor output signals cycle through a full period. Advantageously, the relation of the field direction angle determined therewith is substantially linear to the position. The count of magnet poles having already passed the sensor chip 12 starting from an initial position can be again determined by known incremental measuring techniques.

Figure 7:
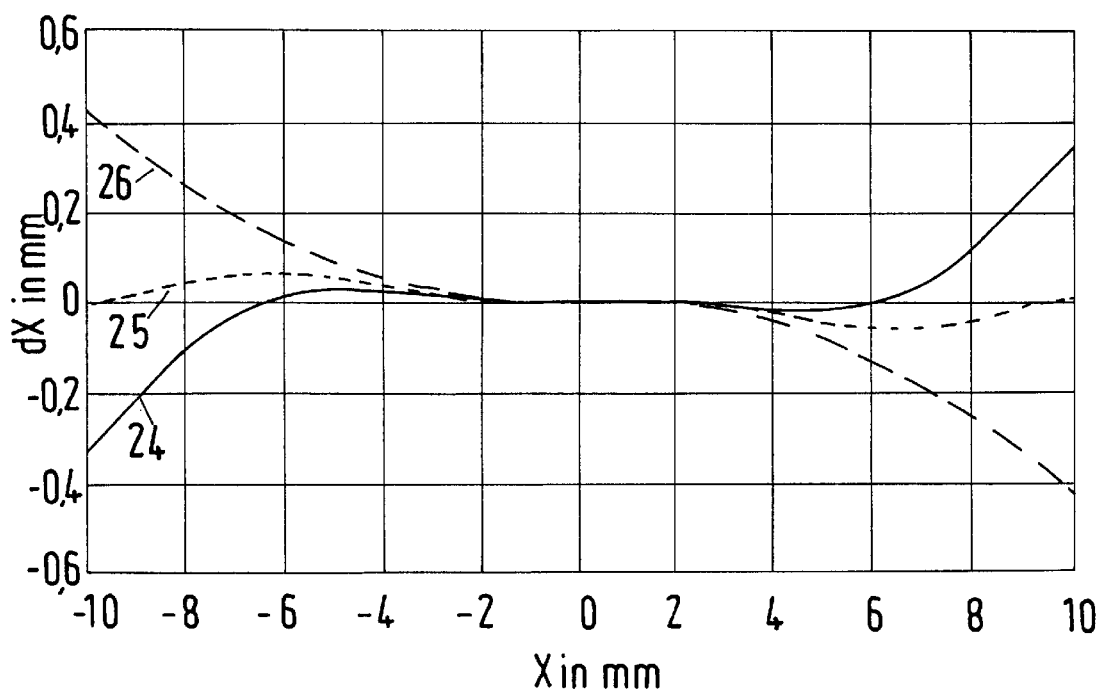
FIG. 7 shows the relationship between the position error and the measured position of an arrangement comprising a sensor chip and bar magnet.

FIG. 7 shows the substantial linearity of the relationsship between the field direction angle determined by the sensor chip and the position variation. The results presented here have been obtained under the condition of using a magnet 22 consisting of only a single area 23. This area has a length of 20 mm and a cross-section of 10×10 mm$^2$. In this graphical representation, the error resulting by linearity relating the measured angle to the position in direction of movement is plotted. Graph 24 applies to a distance of 10 mm between the sensor chip 12 and the magnet 22, graph 25 to a distance of 10.7 mm and graph 26 to a distance of 12 mm. For a total measuring length of 20 mm, the error remains under 0.1 mm for the optimum distance of 10.7 mm, If only a measuring distance of 10 mm is utilized with a magnet having a length of 20 mm, the measuring error is still smaller than 0.1 mm when the distance between the sensor chip 12 and the magnet varies by 2 mm. It is to be appreciated that these results of measurement are neither dependent on the temperature of the sensor chip 12 nor on the temperature of the magnet 22.

What is claimed is:

1. A sensor chip for determining a sine and cosine value of the angle of the direction of a magnetic field with respect to a line on the chip surface said sensor chip having a plurality of magnetoresistive Wheatstone bridges comprising a sine bridge and a cosine bridge, each of the sine and cosine bridges comprising bridge arms, and the resistances (1.1 to 1.8) of said sine and cosine bridges comprising a series circuit made of a plurality of magnetoresistive laminated elements (2), two current terminals of each laminated element being formed from electronically highly conductive thin film surface elements (3) which cover and overlap the laminated elements (2) at two opposite rims thereof, respectively, and which at their sides facing each other are each defined by an edge (4), said edges (4) of each resistance being parallel to each other characterized in that the rims of the magnetoresistive elements (2) are defined by any continuous, plane geometric figure, that the parallel edges (4) of the electrically highly conductive thin-film strips (3) on the magnetoresistive elements (2) of said resistances which are connected in series (1.1 and 1.2; 1.3 and 1.4; 1.5 and 1.6; 1.7 and 1.8) in each bridge arm mutually define an angle (5) of about 90° respectively, and that the edges (4) parallel to each other of the highly conductive thin-film strips (3) on the magnetoresistive elements (2) of the resistances which correspond to each other in the sine bridge (1.1; 1.2; 1.3 and 1.4) and the cosine bridge (1.5; 1.6; 1.7 and 1.8) form angles of about 45° with each other, respectively, and that the edges (4) parallel to each other, which belong to the sine bridge, are inclined with respect to said line on the chip surface by an angle (6) of about 45°.

2. The sensor chip of claim 1, characterized in that rims of each magnetoresitive element (2) are defined by the same continuous, plane geometric figure and that each one of the laminated elements (2) comprises the same material.

3. The sensor chip of claim 1, characterized in that said continuous, plane geometric figure is a square.

4. The sensor chip of claim 1, characterized in that said resistances (1.1. to 1.8) of said bridges consist of one or plural linear resistance areas (7) which are composed of magnetoresistive laminated elements (2) being geometrically arranged in a line.

5. The sensor chip of claim 4, characterized in that both bridges are connected to the same operating voltage contacts (8).

6. The sensor chip of claim 5, characterized in that, at the same operating voltage contacts (8) the linear resistance areas (7) which are adjacent to each other, alternatingly belong to the sine and to the cosine bridge, respectively.

7. The sensor chip of claim 6,
characterized in that the four linear resistance areas (7) which are adjacent to each other and which alternatingly belong to the sine and to the cosine bridge, respectively, form in common a meander branch (9) and that the resistance areas (7) which belong to the same resistance, respectively, are connected in series in successive meander branches.

8. The sensor chip ot claim 7,
characterized in that the number cf the meander branches is even.

9. The sensor chip of claim 8,
characterized in that the both said resistances (1.1 and 1.2; 1.3 and 1.4; 1.5 and 1.6; 1.7 and 1.8) of each bridge arm of both said bridges are symmetrically arranged with respect to the center line (10) of the sensor chip (12).

10. The sensor chip of claim 9,
characterized in that each contact surface (13) for connecting the bridges is arranged along a chip edge (14).

11. The sensor chip of claim 10,
characterized in that all said magnetoresistive elements (2) and the connecting lines, all said contact surfaces (13) for connecting the bridges and all said connecting lines are in one plane.

12. The sensor chip of claim 11,
characterized in that balancing surfaces (11) to balance both bridge zero voltages are provided.

13. Use of a sensor chip of claim 1 for measuring an angle, characterized in that a magnet rotatable with respect to the sensor chip (12) is provided.

14. Use of a sensor chip of claim 1 for measuring an angle, characterized in that, above or below the chip plane having as axis the mid-vertical (16) of the sensitive surface (17), a permanent magnet (15) is rotatably mounted, which magnet is magnetized in a direction parallel to the chip surface and the mid-vertical (18) of the magnet coincides with the mid-vertical of the sensitive surface (17).

15. Use of a sensor chip of claim 1 for measuring an angle with high resolution, characterized in that the plane of the sensor chip (12) is located in the plane of a magnet wheel (19) which, at least along its circumference (20) is alternatingly magnetized in opposite directions, and is located in close relation to said circumference (20), and that the chip edge (21) of the sensor chip (12), which opposes the chip edge (14), along which the contact surfaces (13) of the bridge connection are located, is directed to the center of the magnet wheel (19).

16. Use of a sensor chip of claim 1 for measuring a position, characterized by the provision of a magnet linearity movable with respect to the sensor chip (12).

17. Use of a sensor chip claim 1 for measuring a position with high resolution, characterized in that, above a straight and planar magnet (22) which is alternatingly magnetized in opposite directions within certain areas (23), a sensor chip (12) being relatively movable with respect to said magnet in the londitudinal direction thereof, is, with its chip surface lying in direction of movement, orthogonally arranged with respect to the surface of the magnet (22).

18. The sensor chip of claim 1 in which said line on the chip surface coincides with a chip edge (4).

19. A sensor chip for determining a sine and a cosine value of the angle of the direction of a magnetic field with respect to a line on the chip surface, said sensor comprising a sine bridge formed from a magnetoresistive Wheatstone bridge, and a cosine bridge formed from a magnetoresistive Wheatstone bridge, the resistances of said bridges comprising a series circuit of a plurality of magnetoresistive laminated elements, characterized in that:

the peripheral rims of the magnetoresistive elements are each defined by a continuous, plane geometric figure, the length of which is substantially similar to the width thereof, each magnetoresistive element comprising a pair of current terminals formed from electrically highly conductive thin-film surface elements which cover and overlap laminated elements of said magnetoresistive elements at two opposite rims thereof respectively, and in which the sides of said magnetoresistive elements facing each other are each defined by an edge of respective parallel edges of the electrically highly conductive thin-film surface elements positioned on the magnetoresistive elements, and further in which pairs of said resistances each define a bridge arm connected in series, which resistances mutually occupy an angle of about 90° respectively, and the corresponding resistances which form the sine bridge and the cosine bridge respectively form angles of about 45° with each other, said parallel edges of the sine bridge being angled with respect to said line on the chip surface by about 45°.

20. The sensor ship of claim 1 in which said line on the chip surface coincides with said edge of the chip.

* * * * *